United States Patent [19]
Zampetti

[11] Patent Number: 5,943,381
[45] Date of Patent: Aug. 24, 1999

[54] MULTIPLE INPUT FREQUENCY LOCKED LOOP

[75] Inventor: George Phillip Zampetti, Livermore, Calif.

[73] Assignee: Symmetricom, Inc., San Jose, Calif.

[21] Appl. No.: 08/850,149

[22] Filed: May 2, 1997

Related U.S. Application Data

[63] Continuation-in-part of application No. 08/642,814, May 3, 1996, Pat. No. 5,751,777.

[51] Int. Cl.$^6$ ...................................................... H03D 3/24
[52] U.S. Cl. ........................................... 375/376; 455/260
[58] Field of Search .................................. 331/1, 16, 25, 331/69, 70, 158; 375/327, 356, 362, 376; 455/12.1, 20, 76, 86, 260

[56] References Cited

U.S. PATENT DOCUMENTS

| | | | |
|---|---|---|---|
| 4,890,305 | 12/1989 | Devries | 375/376 |
| 5,220,292 | 6/1993 | Bianchini et al. | 331/1 |
| 5,307,382 | 4/1994 | Pang | 375/376 |
| 5,311,560 | 5/1994 | Tatsumi et al. | 375/376 |
| 5,751,777 | 5/1998 | Zampetti | 375/376 |

*Primary Examiner*—Stephen Chin
*Assistant Examiner*—Joseph Roundtree
*Attorney, Agent, or Firm*—Wilson, Sonsini, Goodrich & Rosati

[57] ABSTRACT

A dual locked loop is disclosed comparing preferably a GPS signal with an E1 signal and the E1 signal with the output of the loop. The GPS signal is low pass filtered to provide a low pass filtered GPS versus E1 signal that is used as a calibration for a closed loop having a second low pass filter for filtering the comparisons of the E1 and the output signal. By appropriately selecting the filter parameters, the output stability can track the stability of the local oscillator driving the NCO for short term stability, the medium term stability of the E1 signal and the long term stability of the GPS signal.

17 Claims, 7 Drawing Sheets

MULTIPLE INPUT FREQUENCY LOCKED LOOP

RELATED APPLICATIONS

This is a continuation-in-part application of U.S. patent application Ser. No. 08/642,814 filed May 3, 1996 now U.S. Pat. No. 5,751,777.

BACKGROUND OF THE INVENTION

1. Area of the Invention

This invention relates to phase and frequency locked loops and more particularly relates to phase and frequency locked loops having multiple inputs.

2. Description of the Prior Art

In many communication applications, each node in the network has its own internal clock running independently of the other clocks in the network. Where the networks are synchronous networks such as in many telecommunications applications and in high speed wide area networks, however, these clocks must be syntonized or synchronized to each other. In certain networks where the concentration of traffic in very large central offices permits expensive clocking solutions such as American Telephone and Telegraph's long distance network, multiple primary reference clocks (PRC's) are distributed throughout the network. Each of these PRC's ensembles multiple global positioning satellite signals received by GPS receivers and steers several rubidium oscillators to track the ensembled GPS time, which serves to represent a universal time scale throughout the network. Since the cost of a PRC is quite high, for other nodes throughout the network, the local oscillator clock for a given node is synchronized or syntonized to the PRC clock through a locked loop. The traceability of the local clock back to universal time depends upon the overall network architecture and the use of expensive oscillators and minimizing the number of cascaded clocks from the PRC site to the local office. The cost of all of the supporting processing elements throughout the network is quite high.

For networks having a relatively small number of nodes (on the order of several hundred) and where there is a high volume of traffic, such costs for maintaining a high degree of traceability may be justifiable. It is more difficult to bear these costs for lower traffic networks such as privately operated nodes coupled to long distance switching networks. Also, in networks having many more nodes such as in digital cellular telephone networks, data networks such as ARDIS, at least some paging systems and PCS, the nodes should preferably be syntonized to each other. Given either the low amount of traffic, or the immense number of nodes, it is expensive and often impractical to have a large number of nodes having clocks traceable to universal time using conventional techniques scattered throughout the network.

As alternatives, there are several alternative sources for timing signals. One example is GPS; however, the short term stability and reliability make it unusable as a direct source of timing in network applications. While the long term stability of a signal such as GPS is generally very good, even exceeding the stability of atomic clocks, the short term stability of GPS signals makes it totally unreliable. In particular, the short term timing solution recovered from a GPS receiver is impaired by both linear and non-linear noise components introduced by the source, communication channel and the receiver. The result is that the recovered timing signal short term stability is characterized by both short term noise such as white noise phase modulation and white noise frequency modulation and by short outages and phase transients. The short term instability and reliability of such received GPS signals makes them inadequate for timing a variety of nodes in a network.

To reduce cost, lower cost quartz based oscillators can be used to replace Rubidium as the local flywheel oscillator in a GPS receiver base PRC. Oven base quartz oscillators still are relatively costly (several hundred dollars or more) and produce significant timing instability over the flywheel times required to manage and suppress the short term noise on the GPS timing signal. Other even lower cost non-oven based oscillator solutions are completely unsuitable because their medium term stability is even worse. Another fundamental problem with using a GPS receiver with a single local oscillator is if there is excessive instability in the control loop, there is no independent means to determine if the source is the GPS receiver or the local oscillator.

As an alternative clock signal source, timing information can be extracted from telephony network based reference signals such as received OC-3 or DS-1 signals. However, these signals often have a worse frequency stability than a quartz oscillator for short time measurement periods on the order of seconds while the OC-3 or DS-1 signal has a worse frequency stability than GPS over longer measurement periods on the order of tens of minutes. Further, the stability of the timing signals extracted from E1 or DS-1 signals over the medium measurement periods from several seconds to tens of minutes is normally better than GPS or a local quartz oscillator. As a result, there is no one signal that can be used as a timing source for frequency stability throughout short, intermediate and long term stability constraints that is economically available.

Another alternative is to use an ensemble of local oscillators to improve the stability of the overall quartz oscillator resource and provide fault detection. However this requires at least two local oscillators at each location which is a significant cost issue.

Therefore, it is a first object of this invention to provide good stability clock source for the short term, intermediary and long term measurement intervals. It is yet another object of this invention to provide such a timing source that is reproducible throughout an entire network having a large number of nodes without a substantial per node cost.

SUMMARY OF THE INVENTION

These and other objects are achieved by a multiple source frequency locked loop such as a dual frequency locked loop. In such multiple source frequency locked loops, one signal such as a locally generated quartz oscillator provides the best stability over short term measurement intervals while one or more received second signals such as an E1, DS 1, or OC3 signal provide the best stability over intermediate time measurement intervals and a third source such as GPS or LORAN provides the best long term stability. The multiple input frequency locked loop provides stability substantially equal to or better than the best of the three sources available for any specified time measurement interval and each of the three sources will be used as controls for the output.

Preferably, the local reference oscillator, which has the best short term stability is coupled directly to the output of the control loop. The signal with the best intermediate period stability should be used as a first reference to steer the output of the control loop for intermediate stability. This closed loop may use a Type I, Type II or Type III control loop. The third input signal, which has the best long term stability such as GPS or LORAN may be used in an open loop manner for calibration and steering of the signal of the closed loop. The control loop is structured so that only one digital synthesizer is actually required no matter how many network inputs are used. A separate dual input control loop is operated in software for each network input. The actually output timing signal from the single synthesizer is not part of the control loops. The loop filter constants are chosen so that the predominant effect on stability of the three signals are selected to maximize stability of the output signal.

DETAILED DESCRIPTION OF THE PREFERRED EMBODIMENTS

Figure 1:
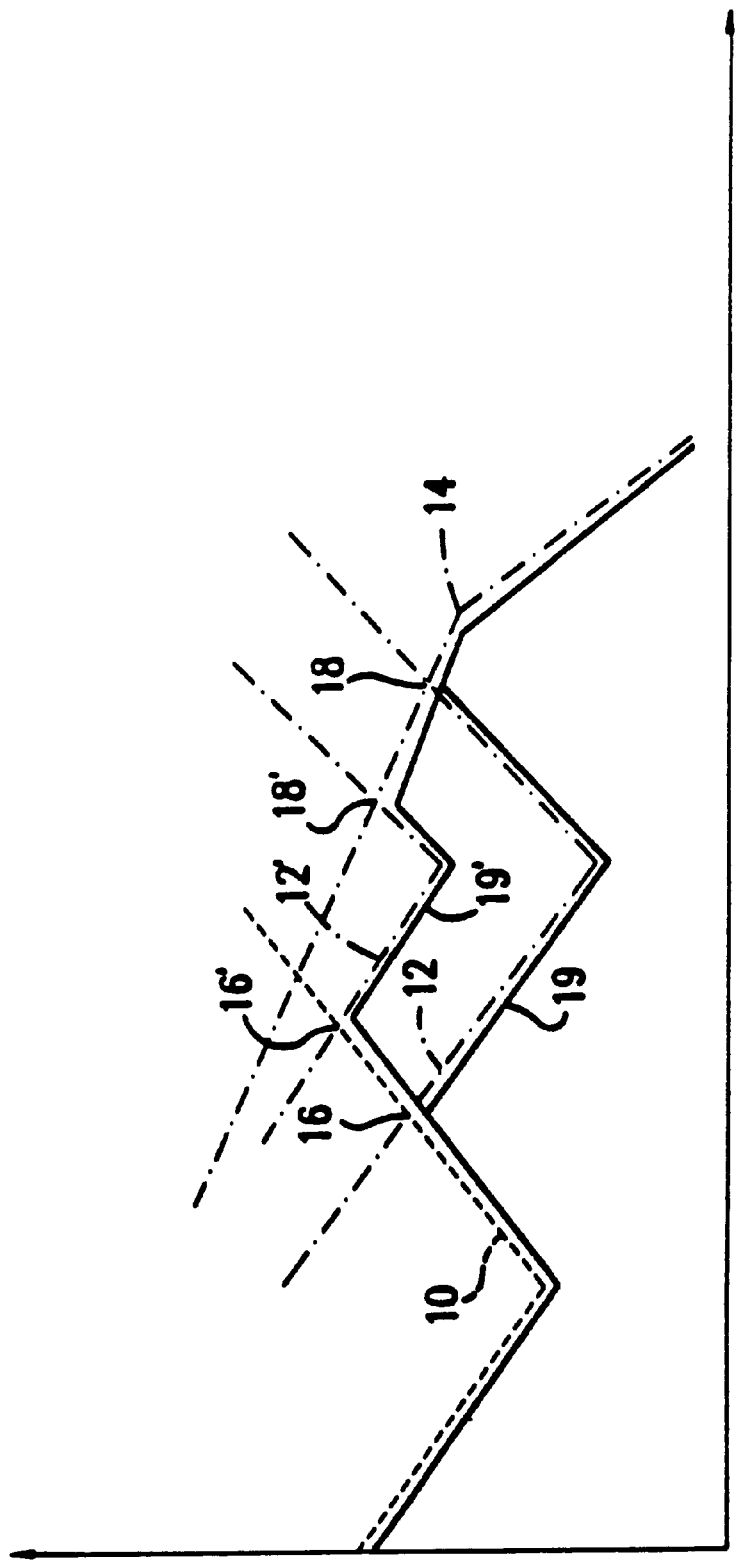
FIG. 1 is a plot of hypothetical frequency stabilities of various input and output signals.

FIG. 1 shows an illustrative hypothetical plot the overall frequency stability curves (Allan or Modified Allan Variance Curves) 10, 12, 14 that may be measured for a typical temperature compensated crystal local oscillator, an E1 or DS1 signal received from either a coaxial or optical landline or microwave link and a GPS signal received with a GPS receiver, respectively. These curves are the measured signal's stabilities using either an Allan or Modified Allan Variance frequency stability measurement statistic with the abscissa representing the log of the integration time and the ordinate representing the log of the frequency instability noise power. The local oscillator curve 10 shows the local oscillator has the best frequency stability out to about an integration or measurement constant of about four seconds. Between about four and about two thousand seconds (two hours), the DS1 or E1 signal has the best stability estimate as shown by curve 12. Beyond about 2000 seconds, the GPS has the best stability estimate as shown by curve 18. As can be seen, there are two cross-over stability points, 16, 18 where the curves 10 and 12 and 12 and 14 intersect respectively, the first at about four seconds and the second at about 2000 seconds.

The object of the dual source locked loop is to provide an output clock signal having short term stability curve 10, the intermediate stability curve 12, and the long term stability curve 18. This is shown by the solid line 19 representing the desired Modified Allan Variance that substantially tracks the optimal portion, of each of the three stability curves from each of the available sources. Therefore, the dual source locked loop has substantially the same short term stability as the local oscillator, substantially the same mid term stability as the E1 or DS1 signal and substantially the same Long Term stability as the GPS signal. Such selection of the optimal portions of each curve may be accomplished via calculating Allan or Modified Allan Variances for each curve to arrive at the intersection points.

Further, the Allan Variance or Modified Allan Variance curves for the various input signals are not fixed but will vary somewhat due to noise and other environmental factors. Therefore, the dual source locked loop processor (discussed below) may periodically determine the intercept points 16, 18 of the three Modified Allan Variance curves for the different signals and alters the filtering constants (discussed below) so that the optimal short, mid and long term stability is selected. For example, if curve 12 deteriorates to curve 12', then the intercept points 16 and 18 shift to points 16' and 18'. Output curve 19 should become output curve 19'. The processor may determine if either the E1 or the GPS signal has degraded to an unacceptable level. If the E1 is declared unacceptable the dual input control loop is no longer used. Instead, a back-up single GPS input control loop is operated in the background (as described later). The output of this back-up control loop is used when the E1 is unavailable. If the GPS signal is unacceptable, the dual control loop is operated with the calibration loop input set to zero. The output of the calibration control loop is the best predictor of the future E1 frequency bias.

Figure 2:
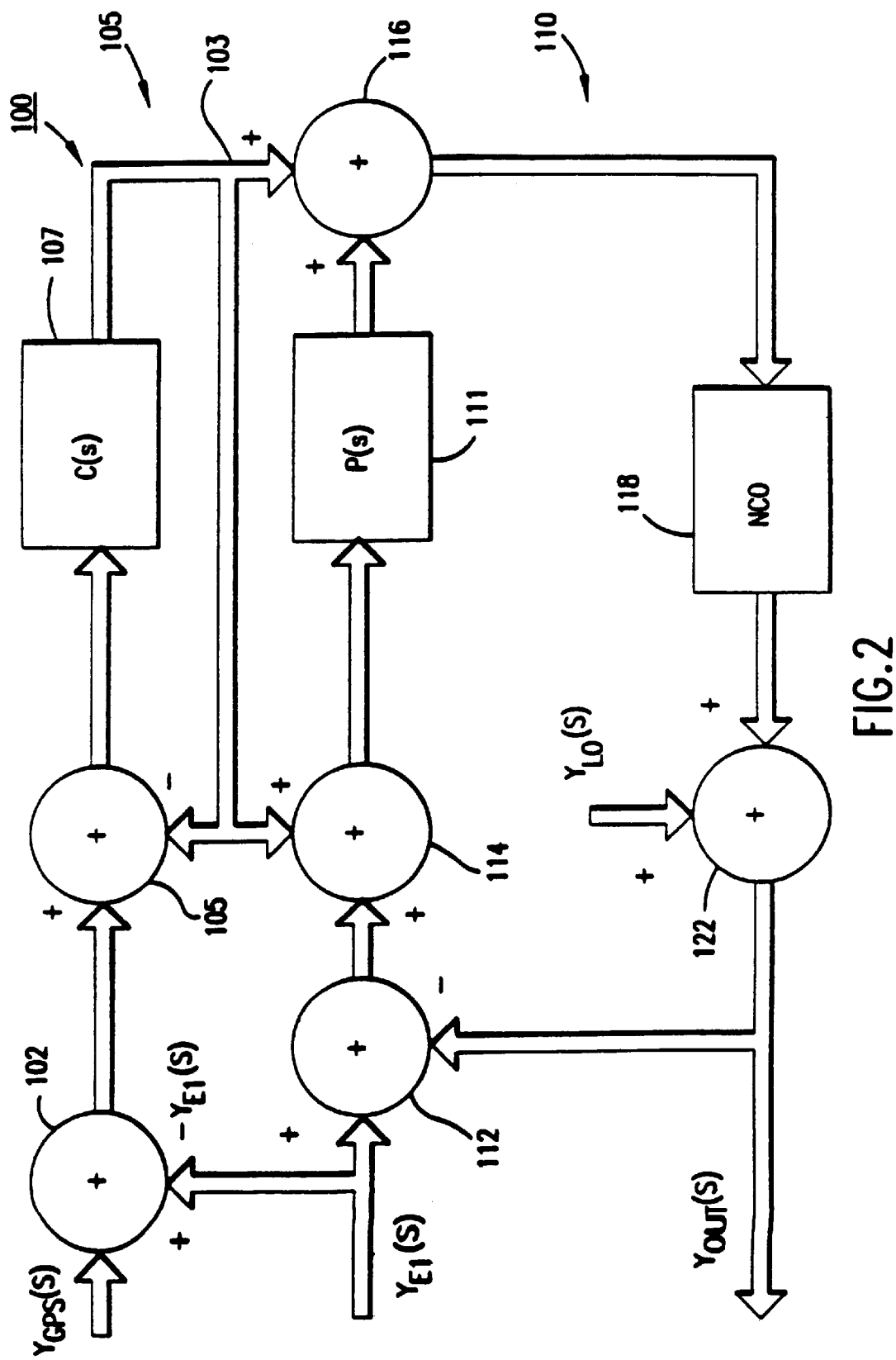
FIG. 2 is a laplace domain model of a first embodiment of the invention.

FIG. 2 shows a Laplace domain model 100 of a dual frequency locked loop. Three input signals are provided to the loop, a GPS signal $Y_{GPS}(S)$, an E1 signal, $Y_{E1}(S)$ and a local oscillator signal, $Y_{LO}(S)$ and the loop provides an output signal, $Y_{OUT}(S)$.

A calibration loop which operates independently of the local oscillator of NCO output 105 has a first frequency comparator 102 that measure the frequency or incremental phase difference with zero dead time between the two external signals, $Y_{GPS}(S)$ and $Y_{E1}(S)$. The frequency or other difference measurements are then processed by a calibration filter C(S) 107, having a Type 1, 2 or 3 open loop PLL design to provide an estimate of the long term frequency calibration to correct for any primary rate (E1 signal) frequency offset. It should be noted that this calibration loop 105 uses an open loop frequency measurement for providing the calibration estimate at the output 103 since the output signal $Y_{OUT}(S)$ is not measured in the calibration loop 105. Also, the filter constants in filter C(S) 107 will need to be adjusted to provide the proper Allan Variance or Modified Allan Variance crossover or intersection points for the output stability with respect to the E1 and the GPS signals as the various signals' relative stabilities change in a manner explained in connection with FIG. 1.

The primary loop 100 is a closed loop and measures the frequency difference of the output signal $Y_{OUT}(S)$ against the E1 signal $Y_{E1}(S)$ with a frequency, phase, or other timing difference detector 112. The output of the detector 112 represents a frequency or incremental time difference and is summed by summer 114 with the output of the calibration loop 103, filtered with the P(S) filter 111 and the result is summed again with summer 116 to provide the control data for the numerically controlled oscillator (NCO) 118. The selection of the time constants, of the filter P(S) is done to manage the Allan Variance or Modified Allan Variance crossover point, to maximize short term stability from the local oscillator and the intermediate term stability from the reference signal E1. The NCO 118 uses the local oscillator signal $Y_{LO}(S)$ to provide the output signal. In applications where low phase noise is required (such as CDMA cellular radio), the output of the NCO is coupled to a phase locked loop (not shown) to suppress spurious phase modulation introduced by the digital synthesis process. The output of the NCO (or with optional noise suppression phase locked loop) is $Y_{out}(S)$.

It should be noted that the output of the calibration loop 103 is provided twice to the primary loop 110 at summer 114 and summer 116 to cancel out the negative feedback of the NCO path so that the primary loop 110 operates independently of the calibration loop 105. With the calibration loop 105 provided with no NCO feedback, the calibration loop 105 operates in an open loop, and the calibration loop 105 is decoupled from the primary loop 110 along with having the output 103 negatively fed back at adder 105.

Figure 3:
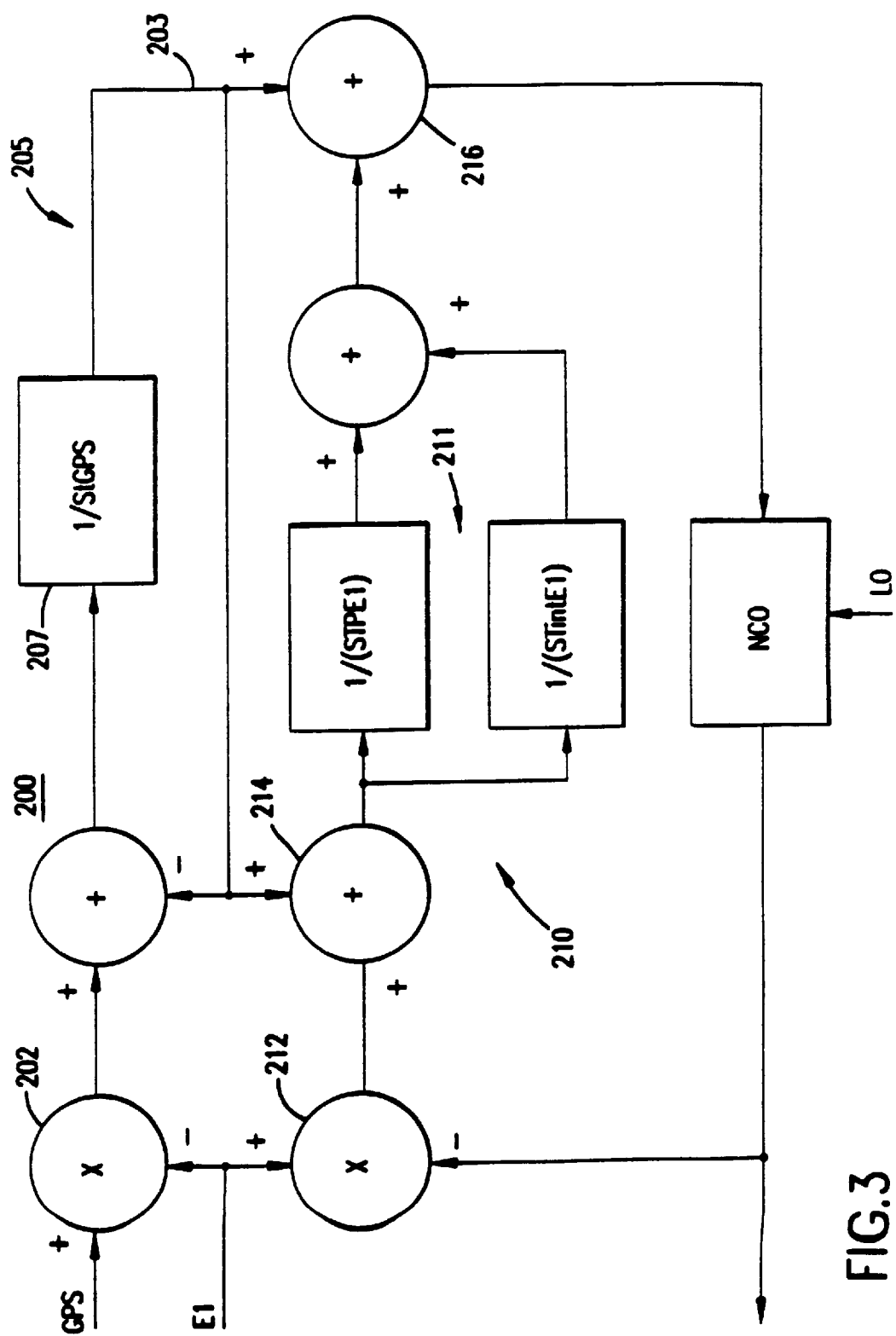
FIG. 3 is a block diagram of the embodiment of the invention.

FIG. 3 shows a block diagram implementation 200 of the Laplace domain implementation 100 shown in FIG. 1. The calibration loop 205 measures the frequency difference between the E1 and the GPS signals at comparator 202. The frequency difference measurement is then provided to a Type 1 control loop 207 that filters this first frequency difference and provides a calibration output 203.

The primary loop 210 measures the frequency difference between the output signal OUT and the E1 signal at a frequency comparator 212, sums that frequency difference with the output 203 of the calibration loop at summer 214 and then performs a Type 2 control loop filter 211 having integration filter constant $S_{INTE1}$ and a proportional filter constant $S_{PE1}$. The output of the filter 211 is coupled to a second summer 216 that adds the output 203 of the calibration loop to provide the control data N for the NCO. The primary loop may be of Type 1, Type 2 or Type 3 as required by the application. In general Type 2 is adequate with ovenized oscillators while Type 3 is used for non-ovenized oscillators such as TCXOs.

The control loops are structured preferably to use fractional frequency measurements instead of phase or time error. Phase locked looped are normally based on using phase or time error measurements. Since there is only one input in a simple phase locked loop the phase error measurement is driven toward zero. In this dual control loop structure the phase error in the primary loop is not bounded. Since the frequency error is bounded, it is the preferred input error measurement to prevent numerical round off or truncation errors. The frequency error or incremental time error should be measured with zero dead time so that the integral of the frequency error is exactly equal to the time error plus a fixed constant.

Figure 4:
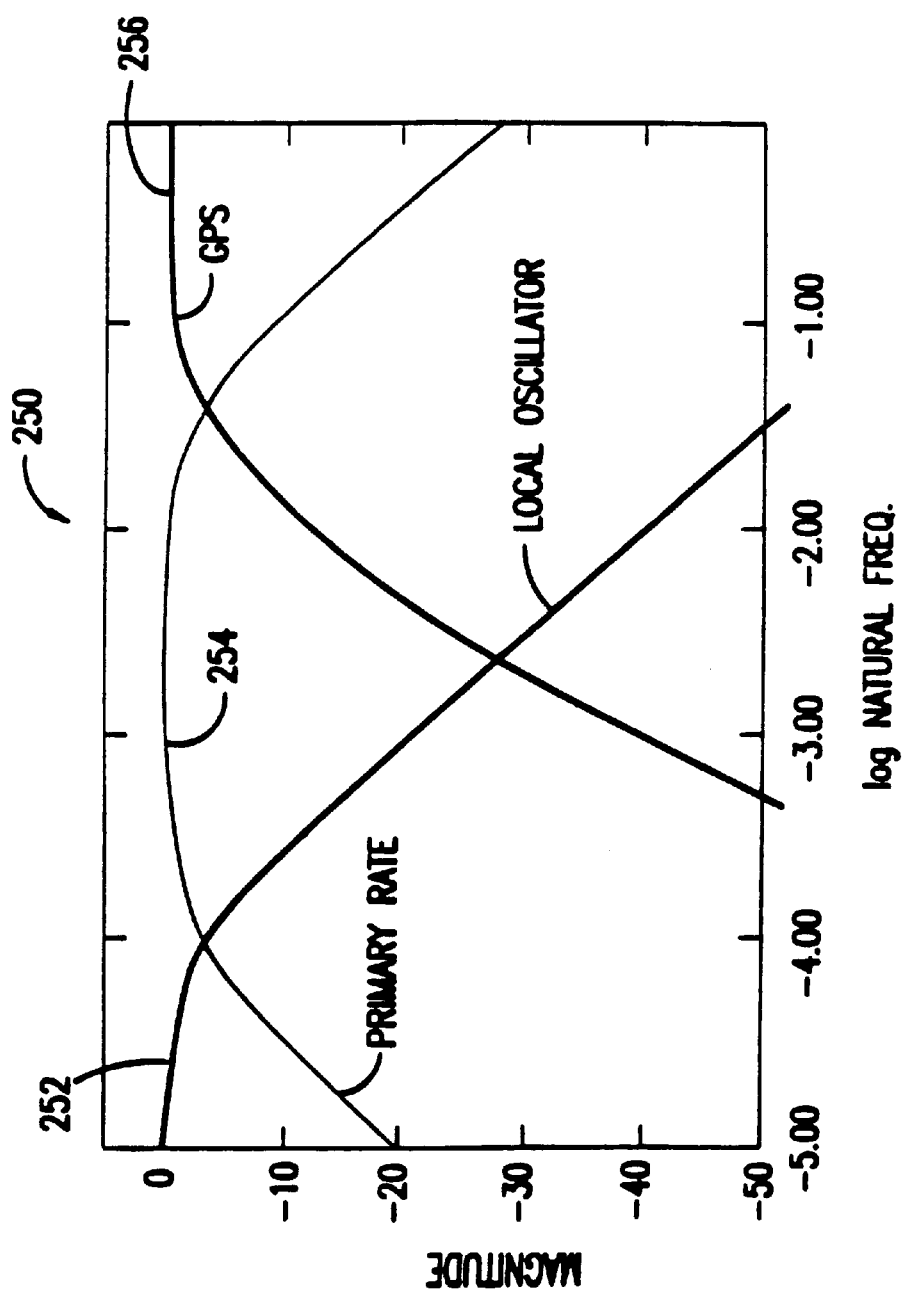
FIG. 4 is a plot of the frequency stability transfer response for the embodiment of FIG. 3.

FIG. 4 shows a power spectrum transfer response 250 with the abscissa representing the log of the natural frequency and the ordinate representing the magnitude of the power spectra in dB. The primary control loop has a twenty five second and one hundred twenty five second proportional and integral time constants respectively while the filter constant of the calibration control loop is 10,000 seconds. The system provides a band pass filter response 254 to the E1 input signal and a high pass filter response 256 to the GPS input signal. The response 252 to the local oscillator is 40 dB/decade roll off low pass filter and is determined by the primary loop type (Type 2 in this case). There must be sufficient roll off to suppress the 1/f noise and the drift processes in the local oscillator.

Of course, as the frequency stability of any of the inputs changes, the response to any of the input signals may be altered by changing the filtering parameters. For example, if the long term stability of the E1 signal improves, the upper limit of the band width of the GPS signal should be lowered. Conversely, if the long term stability of the E1 signal becomes less, the cutoff of the filter for GPS signals should be raised so that the GPS signal has more effect on the intermediate term stability of the signal. Still further if the E1 signal's short term stability decreases, the higher frequency limit of the bandwidth of E1 signal should be decreased so that the LO signal has a greater effect on the intermediate frequency stability.

Figure 5:
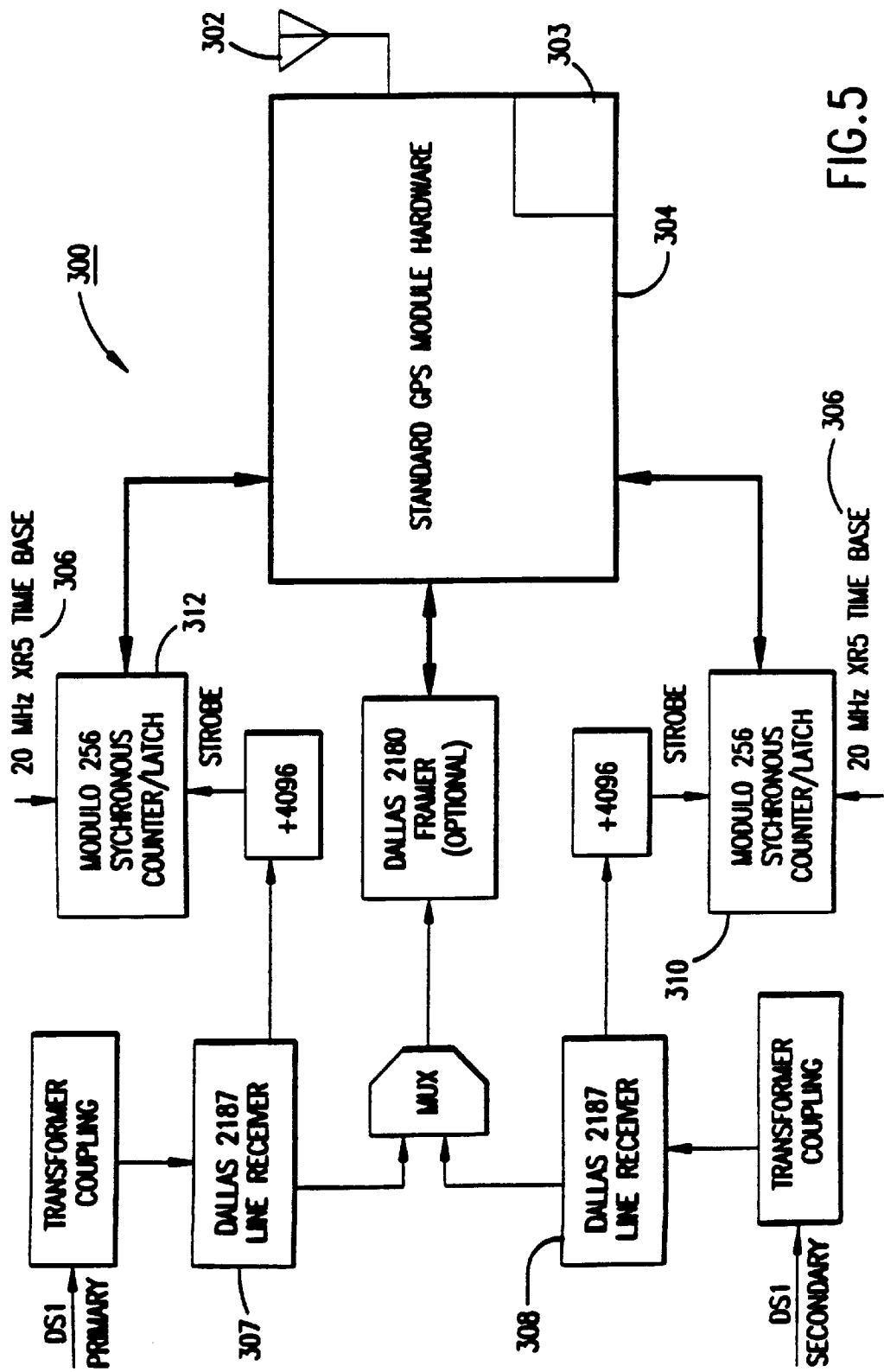
FIG. 5 is a block diagram of a further embodiment of the invention.

FIG. 5 shows a further embodiment 300 of the disclosed invention using a GPS receiver. An antenna 302 receives the transmitted GPS signals that are coupled to a GPS engine 304 such as an XR5 GPS receiver from Navstar of Northampton, United Kingdom. The GPS receiver includes a software GPS engine (not shown) implemented with software on for example a Motorola 68020 (303) with a real time clock as part of the GPS engine (304) that operates synchronously with the 20 MHz XR5 time base. The time base may either be directly from the free running local oscillator or after the NCO. The local oscillator may be a TCXO, DHCXO, OCXO depending on the required cost and performance. The GPS engine 304 includes both a GPS multi-channel receiver and a software Kalman filter (now shown) that provides the various time, phase and frequency estimates and measurements for the received GPS signal and the local oscillator XR5 Time Base 306 including the frequency error difference measurement between the GPS and the time base 306.

The time base 306 is also coupled to two module 256 synchronous counter latches 310, 312 to provide the frequency error zero dead time measurements of two received E1 or DS1 clocks (E1A and E1B) versus the local timebase. In particular, each of the E1 clock signals (E1A and E1B) is recovered by a clock recovery circuit 308, 310 such as are available from Dallas Semiconductor through a transformer coupling and the recovered clock is divided down by (4063) to provide a once per every nominally 1.98 millisecond strobe to periodically latch the latched count process of the modulo counters 310, 312 at the once per 1.98 millisecond rate. The counters 310, 312 latched count process track the frequency error of the local XR5 time base signal versus the corresponding E1 signal. The contents of the latch 308 are sampled by the processor (not shown) in the GPS receiver in synchronization with the measurement performed in the GPS receiver between the local XR5 time base and the received GPS signal. The modulo counters are preferably never reset. Any reset activity will produce dead time and residual frequency error. It should be noted that the nominal incremental count is fractional; i.e., the resultant count between the XR5 time base and the sampling interval is nominally not an integral number of XR5 clock pulses. Therefore, the quantization noise is dithered. In this particular embodiment the nominal incremental count is 253.73 modulo 256 or negative 2.27 count change per update. Further, each sample is preferably time tagged (i.e. has the time according to the real time clock of the processor synchronized to the timebase recorded) when the sample is taken and stored along with the measurement.

The basic algorithm for generating, from the contents of each counter, the change in frequency information while reducing the effects of noise, offsets and other potential sources of errors is as follows. This algorithm is independently valid for each E1 clock, be it E1A or E1B.

The successive sampled values from each latch is stored in a separate FIFO queue for each of the E1A and E1B signals. The most recently stored value C(N) of the counter 308 is compared with the prior value C(N-1) by subtracting the latter from the former. If the magnitude of the difference modulo 256 between the count values exceeds some predetermined limit, indicating that the current sample is bad, then the current sample is discarded. Assuming that all of differences between the samples of C(N) are within the predetermined limit, there will be nominally 128 samples every 250 ms integration interval.

The following pseudo code describes the function of checking of data and filtering:

Step 1:

Every 250 ms perform the following until there are no samples in the FIFO:

| | |
|---|---|
| Get Current Count C(N) <br> $\Delta = [C(N) - C(N - 1)]$ Modulo 256 | /*Calculate difference from prior value (note $\Delta$ is a 32 signed integer)*/ |
| If $|\Delta| < \Delta_{max}$; the discard $\Delta$ | /* Is the $\Delta$ greater than the predetermined limit (less than 16 in this application) */ |
| Else | /* Current delta sample is within acceptable limit*/ |
| $\Delta = <<22$; | /*Multiply (using arithmetic shift) by large gain $2^{22}$ to prevent numerical round off during filtering operation */ |
| $N = N + 1$; | /* Increment number of valid samples*/ |
| $\Delta^{f1}(N) = (\Delta^{f1}(N - 1) <<5 - \Delta^{f1}(N) + \Delta)/32$ <br> $\Delta^{f1\ sum}(N) = \Delta^{f1\ sum}(N - 1) + \Delta^{f1}(N)$ | /*First stage of a binary low pass smoothing filter and integrator before second stage*/ |
| Every fifth count: <br> $\Delta^{f2}(N) = (\Delta^{f2}(N - 1) <<4 - \Delta^{f2}(N)$ <br> $+ \Delta^{f2sum}(N)/16$ <br> $\Delta^{f1\ sum}(N) = 0$: | /* Decimate output of first filter stage and update second binary filter every j$^{th}$ count (j = 5) reset integrated output of first stage after update to second stage*/ |
| $X(N) = X(N - 1) + \Delta^{f2}(N)$; | /*Integrate smoothed delta to generate accumulated time error over nominal 250 ms integration interval Note X(N) is a double precision floating point variable*/ |
| Repeat Step 1 | |

The above algorithm shows a particular embodiment of an efficient digital process to reduce the counter data to an unbiased estimate of the accumulated time error over the 250 ms integration interval. The use of binary filters in either single or cascaded (i.e., series) bases is the preferred embodiment.

If the number of bad values in any given computational period such as 0.25 seconds exceeds a predetermined value, then a given E1 clock for a channel such as E1A is unstable. In that case, the system can go into a hold over mode, the E1A clock can be disregarded, or the other E1 clock E1B can be used.

Once every 250 ms, the accumulated time error estimate X(N) needs to be converted into the zero dead time estimate of the frequency difference between the E1 and the local oscillator (either before or after the NCO). In this implementation example, the 20 MHz time base is after the NCO. First X(N) must be divided by the nominal integration time and scaled to units of fractional frequency (sec/sec). The microprocessor clock is the basis for time tagging each sample in the FIFO. The nominal integration time $\Delta T$ is the difference between the last good sample time tag and the first good sample time tag in the FIFO. (In the following formulae the capital letter Y representing frequency difference measurements, a subscript such as E1-NCO meaning E1 compared with NCO, and the letter "s" as part of a subscript meaning an smoothed estimate and the letter (i) in parenthesis meaning the current value.) Assuming the units for $\Delta T$ is milliseconds, the conversion formula should be as follows:

Biased $Y_{E1-NCO}(i)=(X(N)/\Delta T)$ * 50e-9(sec/count)* 1000(ms/sec)/ $(5*2^{22})$(Overall Filter Gain) $X(n)$ is then reset to zero.

The above frequency difference estimate $Y_{E1-NCO}(i)$ has two sources of bias error that need to be corrected. The first source of bias is the nominal negative 2.27 expected change in delta every latch update. This bias is intentionally added in the data collection process and results in a nominal 57.10066675 ppm offset that must be added to the biased $Y_{E1-NCO}(i)$. The second source of small bias results from the offset inherent in the time base such as from an NCO signal. The biases may corrected by the following formula:

$$\text{Corrected } Y_{E1-NCO}(i) = \frac{\text{Biased } Y_{E1-NCO}(i)}{1 - Y(i)_{SNCO}}$$

The calculation of the smoothed estimate of the NCO bias ($Y_{SNCO}$) is described later.

In the case of only a system single having a primary rate input such as an E1 or T1 signed input, the corrected $Y_{E1-NCO}(i)$ can be used directly as the primary loop feedback error measurement. However, as described later, when there are multiple primary rate inputs, there are multiple dual input frequency locked loops operating in parallel. In this more generalized case, the hardware NCO is being controlled by a weighted average of the output of each dual control loop "software" NCO, which is a virtual NCO. Because a hardware NCO is intrinsically linear (i.e. the NCO offset is known and repeatable as compared to the variable offset of a variation to a varactor controlled oscillator), the primary loop feedback for each dual control loop can be easily recovered. For example, with two primary rate inputs: E1A and E1B, there is a "software NCOs" associated with each input: $SNCO_A$ and $SNCO_B$. The actual hardware NCO correction value (HNCO) at any time is: HNCO=$\alpha$ $SNCO_A$ +$\beta$ $SNCO_B$ where $\alpha$+=1. Since the hardware NCO controls the measurement time base, both the E1A and E1B inputs are measured with respect to the local oscillator corrected by the hardware NCO. For example the corrected estimate of the fractional frequency of E1A with respect to the hardware NCO can be expressed as:

$$Y_{E1A-HNCO}=Y_{E1A}-(HNCO+Y_{LO})$$

However the value of the HNCO correction is known and can be added to both sides leaving:

$$Y_{E1A-HNCO}+HNCO=Y_{E1A}-Y_{LO}$$

This yields a "open loop" estimate of the fractional frequency of the A input with respect to the free running local oscillator. The primary loop feedback is obtained by subtracting the current value of the software NCO for the "A" channel yielding:

$$Y_{E1A-SNCOA}=Y_{E1A-HNCO}+HNCO-SNCO_A$$

The primary loop feedback for the "B" dual control loop can be derived in a similar fashion.

The calibration loop input ($Y_{GPS-E1}$) is obtained is a two step process. The first step is to calculate an estimate of the fractional frequency offset of the corrected local time base with respect to the GPS time scale ($Y_{HNCO-GPS}$). A general model of a GPS engine includes multiple measurement channels and a state estimation algorithm. The measurements channels provide what is termed pseudo-range data. The pseudo-range is a measurement of the current delay offset required to lock the local code of the GPS code and carrier generator of the received satellite signal. The general state space for a GPS algorithm includes position, velocity as well as clock states. The state update algorithm (typically a Kalman filter) recursively updates the state estimates using the pseudo-range input and associated data from the GPS system. The clock states include a bias term $X_{HNCO-GPS}$ for the current time error offset of the local time base with respect to the GPS time scale. In the XR5 GPS engine, up to four state updates are calculated once per second based on using different sets of satellites, and a single weighted average clock bias update is determined. $Y_{HNCO-GPS}$ is calculated from this single, weighted average clock bias as follows:

Calculate the Delta clock bias over the 1 second update interval:

$$\Delta_{bias} = X_{HNCO-GPS}(i) - X_{HNCO-GPS}(i-1)$$

1) Qualify the current $\Delta_{bias}$ as good based on predetermined threshold for magnitude and slew rate as well as an acceptable clock bias confidence interval estimate from to Kalman or other state estimation algorithm.

If the $\Delta_{bias}$ good, then calculate the unbiased estimate of $Y_{HNCO-GPS}$ by compensation for small bias in the local corrected time base:

$$Y_{HNCO-GPS} = \Delta_{bias}/(1-Y(i)_{SNCO}).$$

The calculation of the smoothed estimate of the NCO bias $(Y(i)_{SNCO})$ is based on a low pass filter estimate of $Y_{HNCO-GPS}$. Given that the long term frequency offset of GPS is very small (less than 1e-12), the average $Y_{HNCO-GPS}$ is a good estimate of the corrected local oscillator frequency bias. The smoothing filter to obtain Y(i) can be implemented as follows:

$$Y(i)_{SNCO} = Y(i-1)_{SNCO}*(1-1/\tau_s) + Y_{HNCO-GPS}(i)/\tau_s$$

Where $\tau_s$ is the smoothing time constant and should be selected to reflect the nominal minimum Allan Variance frequency stability integration time for the local oscillator with respect to GPS.

Once $Y_{HNCO-GPS}$ is calculated, the second step is the derivation of $Y_{E1-GPS}$ for each E1 input. For each input, a corrected estimate of the fractional frequency error of the input with respect to the hardware NCO is already determined as previously described. The calibration loop input is easily derived as shown for the "A" input:

$$Y_{E1A-GPS} = Y_{E1A-HNCO} + Y_{HNCO-GPS}.$$

Or the E1 "B" input, this can be obtained as follows:

$$Y_{E1B-GPS} = Y_{E1B-HNCO} + Y_{HNCO-GPS}.$$

Thus, having obtained the corrected fractional frequency inputs for multiple dual loop control systems, the update of the "software" NCO may be implemented by a software algorithm performing the following pseudo code operations. (Note that (i) is the index for the current value and "+=" is the C programming operator for accumulation.) The following example shows the implementation for a type 1 calibration loop and a type 2 primary loop for the "A" input.

$$GPS_{Proportional\_State}(i) += -1 *$$
$$(\text{Corrected } Y_{E1A-HNCO}(i) + Y_{HNCO-GPS}(i) + GPS_{Proportional\_State}(i-1)) *$$
$$\tau_0/\tau_{GPS}$$

$$E1A_{Proportional\_State}(i) +=$$
$$(GPS_{Proportional\_State}(i) + \text{Corrected } Y_{E1A-SNCOA}(i) - SNOC_A(i)) *$$
$$\tau_0/\tau_{Proportional}$$

$$SNCO_A(i) =$$
$$E1_{Proportional\_State}(i) + E1_{Integral\_State}(i) + GPS_{Proportional\_State}(i)$$

$$E1A_{Integral\_State}(i) += (E1A_{Proportional\_State}(i)) * \tau_0/\tau_{integral}$$

$SNCO_A(i)$ is the software NCO correction state estimate updated every $\tau_0$ seconds. In this application example $\tau_0 = 0.25$ seconds. The various proportional and integral constants ($\tau_{GPS}$, $\tau_{proportional}$ and $\tau_{Integral}$) are selected to provide the desired crossover points in terms of steering the frequency of the output to provide the lowest overall Modified Allan Variance.

Figure 6:
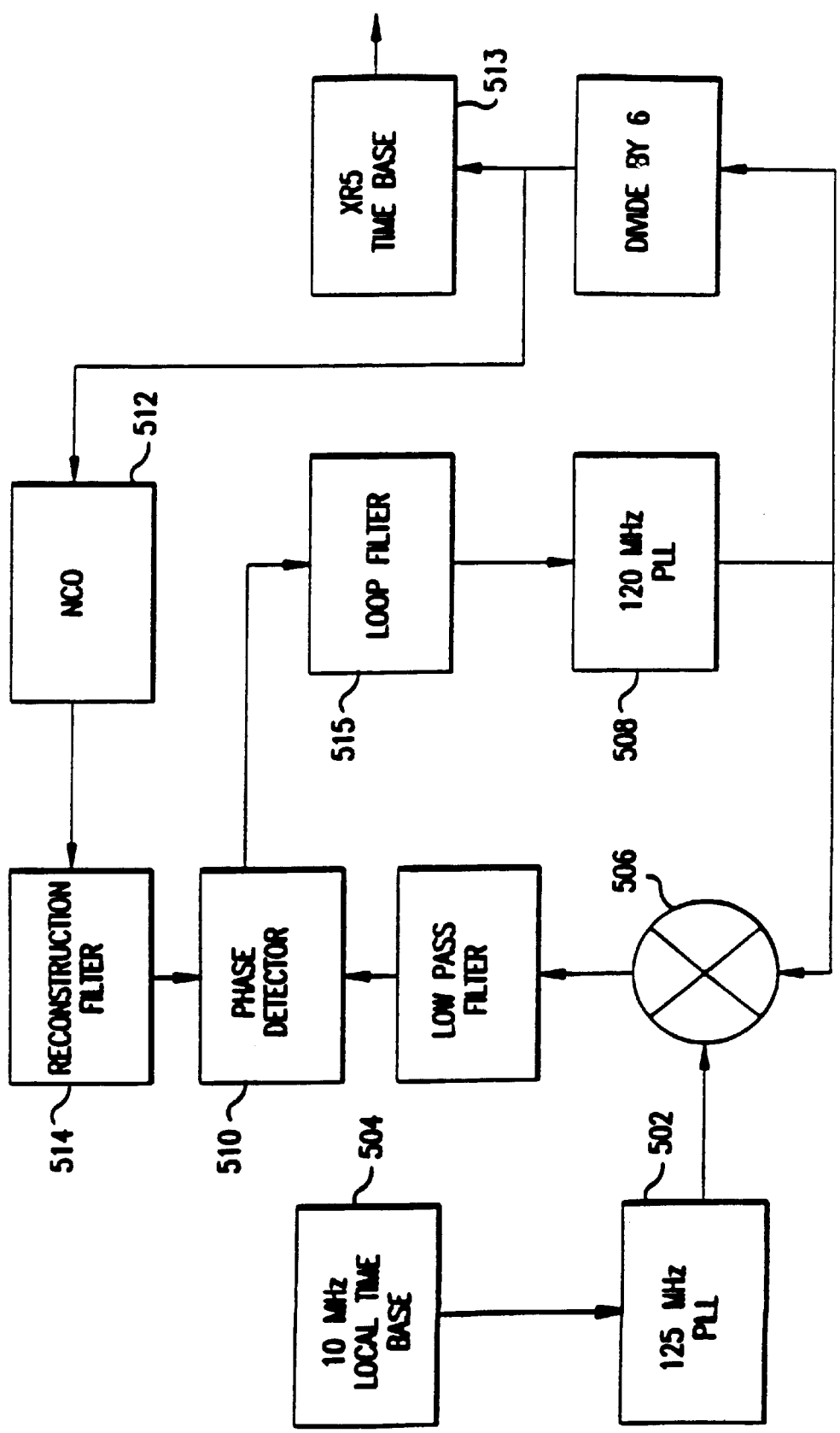
FIG. 6 is a block diagram of a synthesizer that may be used in a further alternative embodiment.

FIG. 6 shows a block diagram of a synthesizer 502 that may be used in an implementation. A local 10 MHz time base 504, which may be generated by a free running oven crystal oscillator is frequency multiplied by an LC phase locked loop 502 to provide a 125 MHz signal that is provided to a balanced modulator 506 to be beat against the output of a 120 MHz VCO 508. The output of the modulator 506 is low pass filtered to provide the nominally 5 MHz signal for phase comparison by a phase detector 510 with the output of a NCO 512 as smoothed by a reconstruction filter 514. The NCO 512 may be an AD7008 CMOS DDS chip available from Analog Devices of Norwood, Mass. The phase detector output is filtered by a loop filter 515 and provided to the 120 MHz VCO 508. The output of the 120 MHz VCO 508 is divided by six to provide a 20 MHz signal to a XR5 time base generator 513 for the GPS receiver (not shown) and to the NCO 504. This hardware synthesizer has the following relationship between output and input fractional frequency:

$$y_o = (25*y_{lo} - 4*r_\Delta)/(25 + 4*r_\Delta) \qquad \text{Eq. NCO-1}$$

The NCO by itself has the standard relationship between input and output frequencies of:

$$f_o = f_{in} * K/2^{32}$$

The term $K/2^{32}$ can be decomposed into fixed and incremental terms. For this implementation:

$$K/2^{32} = 0.25 + r_\Delta$$

where $r_\Delta = \Delta/2^{32}$ and $\Delta$ is the incremental NCO control work. The hardware synthesizer should operated to achieve the following relationship:

$$y_o = y_{lo} + HNCO \qquad \text{Eq. NCO-2}$$

The relationship between equation NCO-1 and NCO-2 is simplified in steady state since $y_o$ is nominally zero therefore $y_{lo}$=−HNCO and equation NCO-1 reduces to:

(25*−HNCO−4*$r_\Delta$)/(25+4*$r_\Delta$)=0

The above equation is only satisfied when the numerator is zero therefore:

(25*−HNCO=4*$r_\Delta$) and finally substituting for $r_\Delta$ yields:

$$\Delta = -25 * 2^{30} * \text{HNCO} \qquad \text{Eq. NCO-3}$$

Equation NCO-3 provides the required hardware NCO control word to obtain the desired hardware NCO correction. Note that in this implementation the NCO control word is update every 250 ms. The actual update interval to the hardware NCO can be much faster. For example the XR5 processor can support an update every 1 ms. Dithering of the least significant bit of the $\Delta$ word is used to extend the resolution of the synthesis process. With dithering, the 3.8e−11 resolution of the hardware synthesizer is improved to an effective resolution of better than 5e−13.

The phase noise and spurious phase modulation for this synthesizer is not limited by the performance of the NCO as is the case with pure direct digital synthesis. The phase noise and spurious modulation of the NCO is translated to the 120 MHz output carrier. However the output frequency required in standard telephony applications is nominally 10 MHz. When the 10 MHz is generated with a divide by 12 operation, the NCO phase noise and spurious modulation is reduced by 21 dB.

As noted earlier the selection of the control word for the hardware synthesizer can be from one of several operating control loops as well as based on a weighted average of each software loop SNCO control state. As already discussed a dual input control loop is associated with each input E1 or T1 primary rate signal. In addition a standard single GPS input control loop is always operated in parallel. The single input control loop has the calibration loop disabled. The primary loop is operated using a $Y_{GPS\text{-}SNCO}$ feedback error signal derived in a manner similar to the other primary loops. Therefore, in the case of two E1 or T1 inputs, there will be three control loops operating in parallel (two dual input and one single input).

Using the three control loop application as an example, the algorithm to generate the Hardware NCO correction can be described. The algorithm has two parts:

1) Determine if the current Software NCO state for each loop is in the normal steady state.
2) Determine weight factors for each Software NCO output that is in steady state operation.

The determination of steady state operation is based on multiple criteria. Both the calibration loop and primary loop inputs are checked for the following:

a) Is the current fractional frequency level within an acceptable predetermined level?
b) Is the rate of change of the fractional frequency (i.e., drift) within an acceptable predetermined level?

If the above tests fail then a transient event is likely on the inputs. An important example is a pointer phase transient event on a Sonet or SDH based network input. In the case of such an event, the primary control loop input is temporarily set to zero. This prevents the pointer transient from impacting the primary feedback loop. Since pointer events are ignored, the primary loop is extracting the medium term stability from the Sonet or SDH carrier and not the payload.

A leaky bucket algorithm is associated for both "a" and "b" type events. If the event rate is too high and alarm is triggered. The leaky bucket is asymmetric so that once an alarm is triggered it will not clear until the control loop is given sufficient time to settle.

The determination of weight factors is based on medium term stability of each of the control loops. Since the local oscillator is common to all three control loops, they all have the same short term stability. Also since GPS is the calibration input to both dual control loops and the only input to the single control loop, all loops have the same long term stability. The medium term stability of each loop is directly related to the medium term stability of primary loop inputs. The medium term stability is calculated for each input with respect to the others and the local oscillator. The modified Allan Variance is used for the earliest integration time inside the medium stability region of two dual control loops (termed $\tau_m$) The three inputs (E1A, E1B and GPS) with the local oscillator provides six relative measurements of $\text{MVAR}(\tau_m)$. Using a standard N-corner hat variance decomposition technique an estimate of the variance of each input and the local oscillator can be calculated from the six relative variance measurements. From these variance estimates, the weight factors for each input and associated control loop output can be determined. For example, if all three control loops are in normal steady state operation then the weight calculation is as follows:

Stability$_{GPS}$=1/ MVAR$_{GPS}$($\tau_m$).
Stability$_{E1A}$=1/ MVAR$_{E1A}$($\tau_m$).
Stability$_{E1B}$=1/ MVAR$_{E1B}$($\tau_m$).
Weight$_{GPS}$=Stability$_{GPS}$/(Stability$_{GPS}$+Stability$_{E1A}$+Stability$_{E1B}$)
Weight$_{E1A}$=Stability$_{E1A}$/(Stability$_{GPS}$+Stability$_{E1A}$+Stability$_{E1B}$)
Weight$_{E1B}$=Stability$_{E1B}$/(Stability$_{GPS}$+Stability$_{E1A}$+Stability$_{E1B}$)

As further noted above in connection with the discussion of FIGS. 1 and 2 and the ability to change the filter constants for the calibration loop (GPS) and the primary loop integral and proportional constants, based upon the stability of the input signals is desirable. Preferably, this is done by calculating the Modified Allan Variance to determine the stability of the local time base, the E1 signals, and the GPS signals. This permits maximizing the stability of the overall output signal as the various sources change.

As already described the controls system determines an estimate of the current fractional frequency error of the following basic inputs:

$Y_{HNCO\text{-}GPS}$ (Fractional frequency of the corrected local time base with respect to the GPS time scale)

$Y_{E1A\text{-}HNCO}$ (Fractional frequency of the E1A input with respect to the corrected local time base )

$Y_{E1B\text{-}HNCO}$ (Fractional frequency of the E1B input with respect to the corrected local time base )

From this basic set a number of related estimates can be easily derived:

$Y_{GPS\text{-}LO}$ (Fractional frequency of GPS with respect to the local oscillator)

$Y_{E1A\text{-}LO}$ (Fractional frequency of E1A with respect to the local oscillator)

$Y_{E1B\text{-}LO}$ (Fractional frequency of E1B with respect to the local oscillator)

$Y_{E1A\text{-}GPS}$ (Fractional frequency of E1A with respect to GPS)

$Y_{E1B\text{-}GPS}$ (Fractional frequency of E1B with respect to GPS)

$Y_{E1A\text{-}E1B}$ (Fractional frequency of E1B with respect to E1B)

The above six relative measurements are required to manage the three control loops for this application example. Each of these fractional frequency estimate inputs can be converted to a time error estimate by digitally integrating:

$$X_{GPS-LO} += Y_{GPS-LO} * \tau_0$$

The Modified Allan Variance (MVAR) can be directly calculated from the time error estimates using the direct form of the algorithm:

$$MVAR(\tau) = E[\{\Sigma(X_{i+2n} - 2X_{i+n} + X_i)\}^2]$$

Where E[ ] is the expected value operator and the summation is from i=1 to i=n. Note $\tau = n\tau_0$.

However, a much more efficient algorithm can be achieved by dividing the above process into two steps:

1) Operate with a linear digital finite impulse response (FIR) filter on $X(n\tau_0)$
2) Calculate the sample variance of the output of the above filtered process.

The above two steps need to be performed for each desired value of $n\tau_0$. For a given value of n, the FIR filter requires that the previous $3n+1$ $\tau_0$ samples be stored. One implementation is to utilize one single store large enough to accommodate the largest n required. However it should be obvious to one skilled in digital filter design that a decimation process can be used for larger values of n. For example, a first store can be set up to accommodate n=16 at the $\tau_0$ update rate. 3N-1 or 49 time error samples must be stored. A second store can be operated at decimate rate of once every 32 $\tau_0$. The input to the store is simply the moving average of the last 32 samples in the first store. The second store can be set up to accommodate n=16, but the integration times for the second store are from $32\tau_0$ to $512\tau_0$. Using the above approach the storage requirements are greatly reduced and redundant filtering operations are eliminated. For example, given that the MVAR is required for n=1,2,4,8 ... $2^{14}$ a single buffer implementation would require 49,153 data elements. By using three stores and decimation the storage requirement is reduced to 147 data elements.

The FIR filter process for a general value of n is as follows:

1) Given a new time error sample at index j in the store:
2) Update the current moving average using samples from index j to (j−n+1)mod49.
3) Update the lag moving average using samples from index (j−n)mod49 to (j−2n+1)mod 49.
4) Update the double lag moving average using samples from index (j−2n)mod49 to (j−3n+1)mod49.
5) Update the second difference output to be: Current moving average−2 * Lag moving average+Double lag moving average.

The MVAR for the given value of n is update as follows:

1) The current MVAR single sample variance is given by: MVAR sample=(Second difference)$^2$ * $3.0/(\tau)^2$
2) The average MVAR power is obtained by using a binary filter to calculate a running estimate of the average MVAR from the sample MVAR for the given value of n. The averaging $\tau$ is selected to yield good confidence and convergence time.

An alternative embodiment 600 (shown in FIG. 7) to the embodiment of FIG. 2 that provides for better operation in the event that the E1 or T1 link is lost. In particular, in FIG. 7, the fractional frequency difference between the local oscillator (LO) and the GPS signal ($Y_{GPS-LO}$) is provided as a first input to the dual input phase locked loop 600 and the second input comprises the fractional frequency difference between the E1 (or T1) and the local oscillator $Y_{E1-LO}$. The two inputs are provided respectively to the subtractors 612 and 602 respectively of the calibration loop 611 and the primary loop 610. The calibration loop includes a calibration filter 610 that processes the differences between $Y_{GPS-LO}$ and the sum of the output of the calibration loop 611 and the primary loop 601 while the primary loop 601 has a filter 604 that processes the differences of the $Y_{E1-LO}$ and the output of the primary loop fed back from output node 606. The outputs of the two loops 601, 611 is summed at an adder 608 to provide the fractional frequency $Y_{NCO}$ for a numerically controlled oscillator (not shown) to provide the local oscillator output after further filtering. By selecting the local oscillator LO as the comparison signal for these two loops (and possibly additional calibration loops) the comparison signal that is used (the LO) is the most reliable comparison signal available.

The output of the primary loop 601 is the numerical correction to lock the local oscillator onto the E1 (or T1) signal. The calibration loop provides an output to steer the local oscillator output over the long term to the phase or the frequency of the GPS signal. If the primary loop however, fails in the embodiment of FIG. 7 (or goes into holdover), the secondary loop in essence becomes a simple phase locked loop.

The loop filter function in the primary loop P(s) may be a class III filter having time constants of forty seconds, one-sixtieth of a second and 800 seconds while the calibration loop filter function C(s) may be a class I filter having a time constant of about 2,000 seconds. Thus, the calibration loop is only sensitive to long term changes between the LO and GPS while the primary loop is only sensitive to shorter term changes of differences between the LO and E1 (or T1) signal. Further, extremely short term changes in the GPS and E1 signals has little or no effect on the changes on the output of the local oscillator in the manner discussed above.

Figure 7:
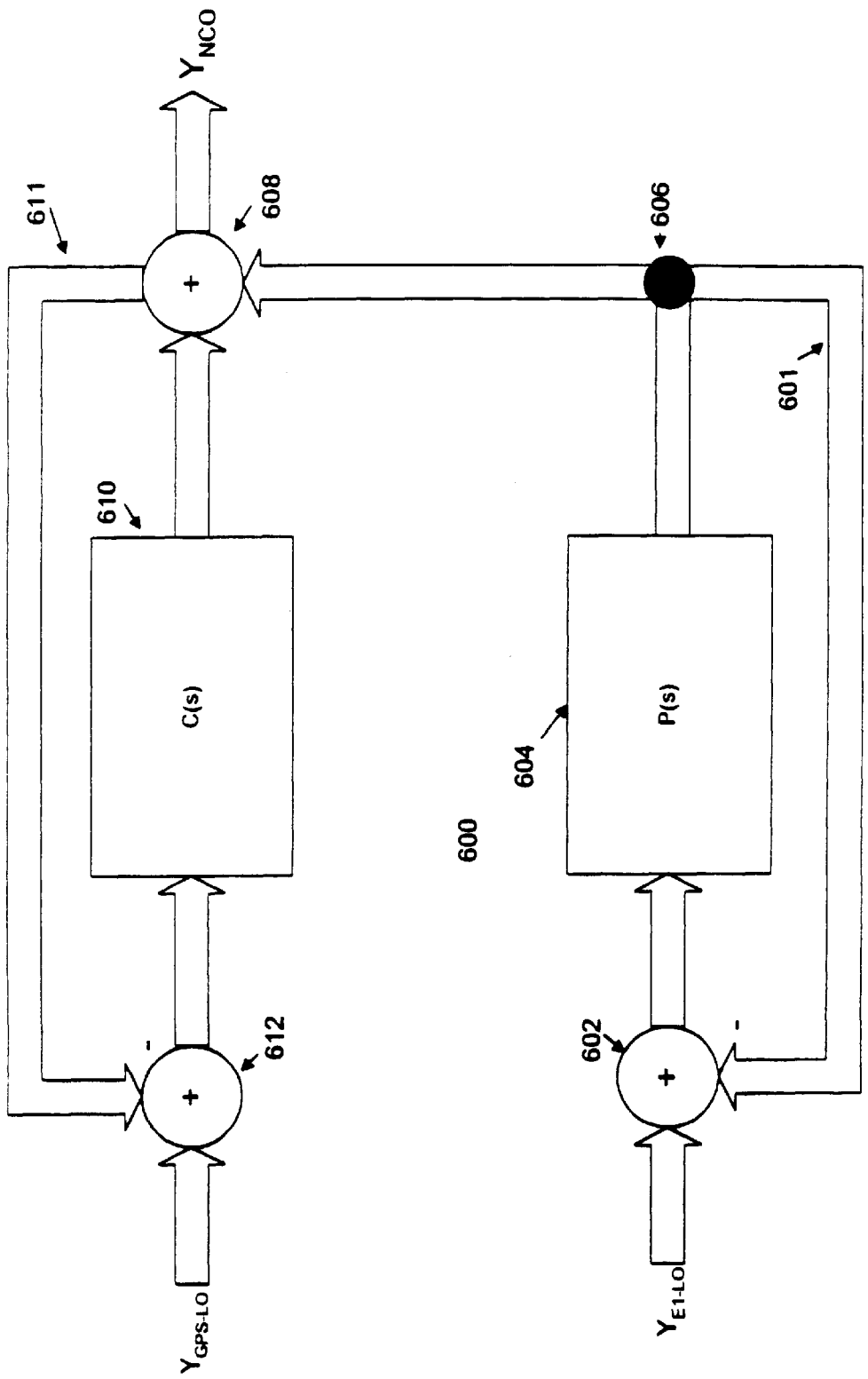
FIG. 7 is a laplace domain model of a further embodiment of the invention.

In the first embodiment of FIG. 2, the two loops were completely decoupled while and in the embodiment of FIG. 7, the calibration loop is not decoupled from the primary loop. Nonetheless, since the calibration loop's time constant is much longer than the time constants of the primary loop in this second embodiment, short term effects from the loss of the primary loop will have substantially no effect on the secondary loop since the time constant of the class III filter is generally at least about five times greater than the time constant of the first loop.

While the embodiment disclosed in FIG. 7 is depicted as the Laplace transform, those of ordinary skill in the art will readily understand how to implement the disclosed embodiment either using analog components and a VCO or by implementing the structure digitally. For example, the embodiment of FIGS. 3 or 5, one of ordinary skill could provide the frequency or phase comparators, the GPS time base, and using either the microprocessor in the GPS time base or a separate microprocessor or DSP, one could use the above described programming techniques to implement the loop structure shown in FIG. 7. Still further, it would be readily apparent how additional calibration loops could be readily added for additional timing sources by summing separately the output of the primary loop to the output of each calibration loop for feeding back to take the difference and then summing the outputs of each calibration loops with the output of the primary loop to drive the NCO. By selecting appropriate time constants for each calibration loop differently, no weighting of the sums is required or alternatively weighted summing to drive the NCO may be used to maximize the controllability of the NCO.

To further improve the performance of the system, the E1 or T1 can be passed through a delay line of about five to twenty seconds before being coupled to the phase or frequency comparator for the primary loop. If transients are detected in the timing information in the delay line, the integrator states for the E1 or T1 signal from the filter in the primary loop can be substituted for the actual data points of the input signal representing the transients. This will effectively remove the transient from the system and permit a more accurate time base.

It will further be understood by those of skill in the field that other embodiments of the invention are also possible such as using OC-3 links or other links for extracting the intermediate signal. Further, in coastal areas to reduce system cost, LORAN may be used in lieu of GPS. Other system parameters may be changed such as sampling intervals of course. The scope of the invention should, of course, be measured by the claims.

I claim:

1. A multiple source loop responsive to at least two input signals and a local oscillator signal, each of the three signals having a frequency associated therewith, each signal having differing frequency stability characteristics such that one signal nominally has the best short term stability, a second signal nominally has the best intermediate term stability and a third signal having nominally the best long term stability, the dual source loop including:

first difference detection means for detecting a first difference between two of the three input signals, the first difference comprising one of a group of frequency and phase differences, second difference detection means for detecting a second difference between two of the three input signals, one of the input signals being different than the two input signals coupled to the first difference detection means, the second difference comprising one of a group of frequency and phase differences;

an oscillating means to provide the output signal having short term, intermediate term and long term stability characteristics;

filtering means responsive to both of the differences to control the oscillating means such that the short term stability of the output tracks the short term stability of the first signal, the intermediate term stability of the second signal and the long term stability of the third signal.

2. The loop of claim 1, wherein the filtering means comprises:

a first low pass filter responsive to the first difference detector and having a first frequency response;

a second filter responsive to the second difference detector and having a second frequency response; and the oscillator being responsive to the output of both of the filters.

3. The loop of claim 2, wherein the first difference means compares the first signal with the second signal and the second difference detection means compares the first signal with the third signal.

4. The loop of claim 3, wherein the filtering means further includes means for determining one of the phase and the frequency difference between the second and the third signals.

5. The loop of claim 2, wherein the output of the first filter is coupled to the input of the second filter.

6. The loop of claim 5, wherein the output of the first filter is coupled to the output of the second filter.

7. The loop of claim 2, wherein each filter has at least one parameter that alters the frequency response of the filter;

means for determining the relative stability of the signals with respect to each other; and means for altering the filter coefficients to maximize the overall stability of the output signal.

8. A method for providing a clock signal having a stability characteristic curve based upon the three separate input signals, each of the three signals having its own stability characteristic curve, each of the stability characteristic curves of the input signals being alterable in response to environmental conditions, the method comprising:

comparing at least one for the frequency and the phase of each input signals with at least one of the frequency and the phase of another of the input signals;

filtering the comparisons with alterable filters;

outputting an oscillatory signal based upon the filtering; and adjusting the filters such that the frequency stability for the output is maximized.

9. The method of claim 8, wherein the stability cures of the adjusting of the filters tracks causes the stability curve for the output for the oscillator to substantially track the most stable portions of the stability curve for each of the three input signals.

10. The method of claim 8, wherein the outputting of the oscillatory signal is done through one and only one synthesizer.

11. A loop apparatus for providing an oscillatory signal having a frequency stability based upon at least three input signals having different stability characteristics, whereby combining the stability characteristics of the three signals provides an optimal stability characteristic, the loop apparatus comprising:

comparison means for determining one of a phase and a frequency difference for two different pairs of the input signals;

filtering means responsive to the comparison means to generate control information;

no more than one synthesizer, said synthesizer having a frequency stability characteristic and responsive to the control information to provide an output signal such that the control information causes the frequency stability characteristic to substantially track the optimal stability characteristic.

12. The loop apparatus of claim 11, wherein each of the signals includes noise and biases, the loop further including estimation means for estimating corrections of at least some of the differences.

13. The loop apparatus of clam 12, wherein the filtering means performs filtering on the differences with altering filtering parameters.

14. The loop apparatus of claim 13, wherein the filter parameters are altered to maximize the frequency stability of the output signal.

15. A method for generating an output signal having a frequency stability based upon a locally generated signal, a signal received over a landline connection and a signal received over a radio link, the method comprising:

repeatedly measuring one of a frequency and phase difference information between the locally generated signal and the landline signal to provide first differences;

repeatedly measuring one of a frequency and a phase difference between the radio link signal and one of the locally generated signal and landline signal to provide second differences;

filtering the first differences with a first filter to provide a first filtered differences;

combining the first filtered differences with the second differences to form a first combined differences;

filtering the first combined differences to provide second filtered set;

combining the first combined set with the second filtered differences to form second combined differences; and controlling an oscillator with the second combined differences to provide an output clock signal having a frequency dependent upon at least the landline signal and the radio signal.

16. The multiple source loop of claim 1, wherein the oscillator means generates the local oscillator signal and the local oscillator signal is provided to both the first and the second detection means, and the filtering means further includes:

a primary loop having an output and being responsive to the difference between the differences determined by the first difference detection means and the output of the primary loop;

a calibration loop having an output and being responsive to the difference between the differences determined by the second difference detection means and the sum of the output of the primary and calibration loops, the oscillating means being steered based upon the sum of the output of the first and second loops.

17. The loop of claim 16, wherein the loop further includes a delay line coupled between the signal having the best intermediate term stability and the first difference detector, such that at least some transients in the signal having the best intermediate term stability can be replaced with data from the primary loop.

* * * * *